United States Patent [19]
Ogita

[11] 3,939,442
[45] Feb. 17, 1976

[54] CERAMIC FILTER CIRCUIT
[75] Inventor: Minoru Ogita, Hamamatsu, Japan
[73] Assignee: Nippon Gakki Seizo Kabushiki Kaisha, Hamamatsu, Japan
[22] Filed: Aug. 23, 1973
[21] Appl. No.: 390,703

[30] Foreign Application Priority Data
Aug. 31, 1972 Japan............... 47-87482

[52] U.S. Cl................................. 333/72; 333/70 R
[51] Int. Cl.² ..................... H03H 7/10; H03H 9/20
[58] Field of Search ...... 333/71, 72, 70 R; 330/174; 310/8, 8.1, 8.2

[56] References Cited
UNITED STATES PATENTS

| | | |
|---|---|---|
| 2,218,087 | 10/1940 | Goering.......................... 330/174 X |
| 3,609,601 | 9/1971 | Phillips et al. ........................ 333/72 |
| 3,633,134 | 1/1972 | Barrows et al................. 330/174 X |
| 3,676,724 | 7/1972 | Berlincourt et al.............. 333/72 X |
| 3,676,806 | 7/1972 | Orchard et al........................ 333/72 |
| 3,686,592 | 8/1972 | Priebe................................. 333/71 |
| 3,716,808 | 2/1973 | Malinowski et al.............. 333/71 X |

Primary Examiner—Archie R. Borchelt
Assistant Examiner—Marvin Nussbaum
Attorney, Agent, or Firm—Cushman, Darby & Cushman

[57] ABSTRACT

Reactance networks are connected just before and just after the ceramic filter element to adjust the linearity of the phase characteristic thereof, thereby reducing distortion.

5 Claims, 9 Drawing Figures ial waves passing through the ceramic filter element of an IF circuit, which is accomplished by providing a reactance circuit at input and output sides of the ceramic filter element to widen the linear zone of the phase characteristic of said filter element.

CERAMIC FILTER CIRCUIT

BACKGROUND OF THE INVENTION

1. Field of the Invention

This invention relates to a ceramic filter circuit for a band pass filter in an IF circuit of a radio receiver.

2. Description of the Prior Art

In most case, a ceramic filter circuit comprises a symmetrical T-shape connection of three ceramic vibrator elements, a symmetrical $\pi$-shape connection of three ceramic vibrators, or a cascade connection thereof, or a single ceramic vibrator having asymmetrically divided electrodes. There are some references, as shown in FIG. 1a, wherein a relatively high resistance resistor R1 is provided in series at the input side of the ceramic vibrator CF and a resistor R2 is in shunt at the output side, thereby forming a low-pass filter together with an input stray capacitor C1 and an output stray capacitor C2, or as shown in FIG. 1b wherein a tuning coil T (which serves also as an impedance converter) is provided between a series resistor R1 and the ceramic filter element CF.

However in the circuit as shown in FIG. 1(a), a distortion occurring upon passing of the frequency modulated waves through the ceramic filter becomes larger towards the higher frequency range as shown by the curve a in FIG. 2, and differs considerably from one circuit to another due to non-uniformity of characteristics of ceramic filter elements.

With the circuit shown in FIG. 1(b), it is possible to provide a good linearity in phase characteristic of the driving impedance of the ceramic filter by a slight adjustment of the tuning coil T, but the Q factor of the tuning coil T must be set at a relatively high value to provide a compensation amount covering a characteristic fluctuation from one ceramic filter element to another, which as a result brings poor linearity in the phase characteristic of the tuning coil itself at both ends of the pass band thereby providing such a characteristic as shown by the curve b in FIG. 2. Furthermore, it is hard to secure a good safety stability against temperature since the coil is used under a condition of Q being high.

FIG. 3 shows a diagram wherein variable resistors VR1 and VR2 are connected in series at the input and output ends of the ceramic filter CF. After adjusting the variable resistors so as to provide a minimum distortion at the modulation frequency of 1kHz, the modulation frequency is sequentially varied from 40Hz to 50kHz to measure the distortion factor exhibiting a result as shown in FIG. 4. From this figure, it is observed that the distortion factor is almost flat within the range of the modulation frequency from 100Hz to 700Hz and its value is below 0.1%, but the distortion factor gradually increases as the modulation frequency goes above 1kHz, representing a value of 0.25–0.42% at 10kHz of the modulation frequency. Curves A, and B in FIG. 4 show respectively the distortions when the ceramic filters are changed, from which it is understood that there are considerable fluctuations in characteristics.

SUMMARY OF THE INVENTION

This invention relates to a ceramic filter circuit used for a band pass filter in a tuner IF circuit, more particulary relates to a ceramic filter circuit wherein reactance networks are provided at input and output sides of the ceramic vibrator element, thereby permitting a linear zone of a phase characteristic thereof to be widened and also permitting to decrease its distortion of the frequency modulation wave caused by its passing through the ceramic filter element. The inventor found that the defects of the conventional ceramic filter circuit were caused by the value changes of the impedance observed at the input terminal, and herein resolve that problem.

BRIEF DESCRIPTION OF THE ACCOMPANIED DRAWING

FIGS. 1–4 are constitutional diagrams of the conventional ceramic filter circuits and operational characteristics of the conventional circuits;

FIGS. 5(a), 5(b) and 7 are constitutional diagrams showing preferred embodiments of this invention; and FIGS. 6 and 8 are charts showing operational characteristics.

DESCRIPTION OF THE PREFERRED EMBODIMENT

Figure 1:
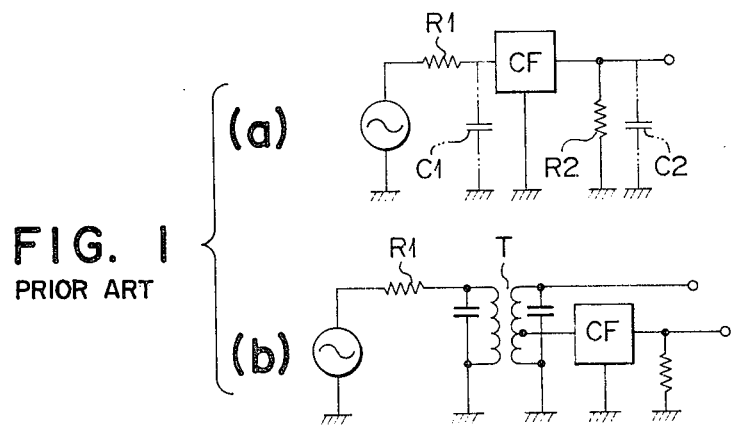
Figure 2:
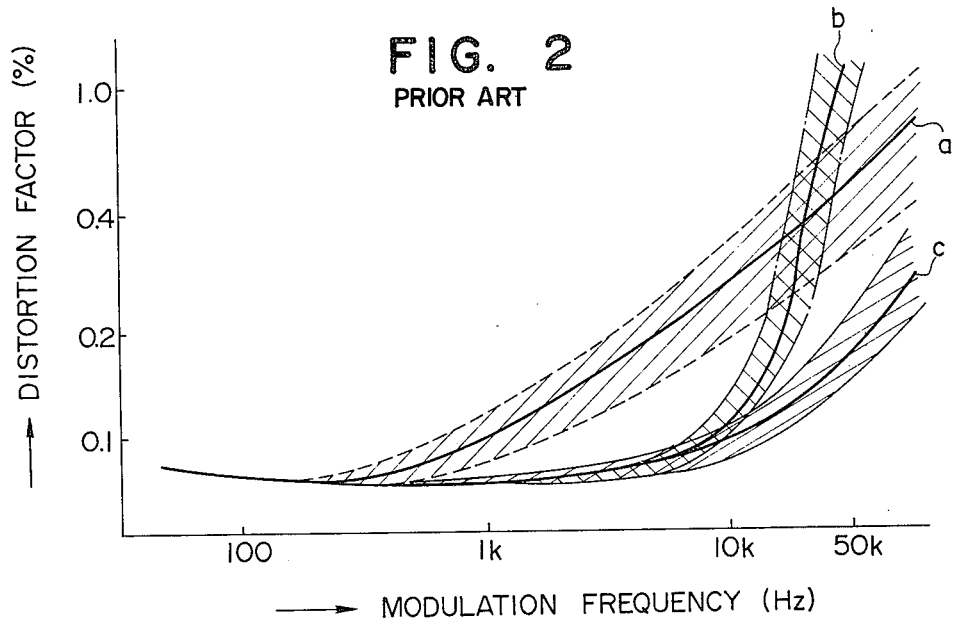
Figure 3:
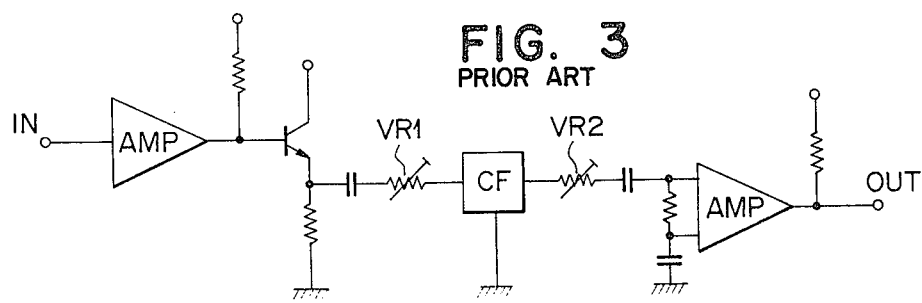
Figure 4:
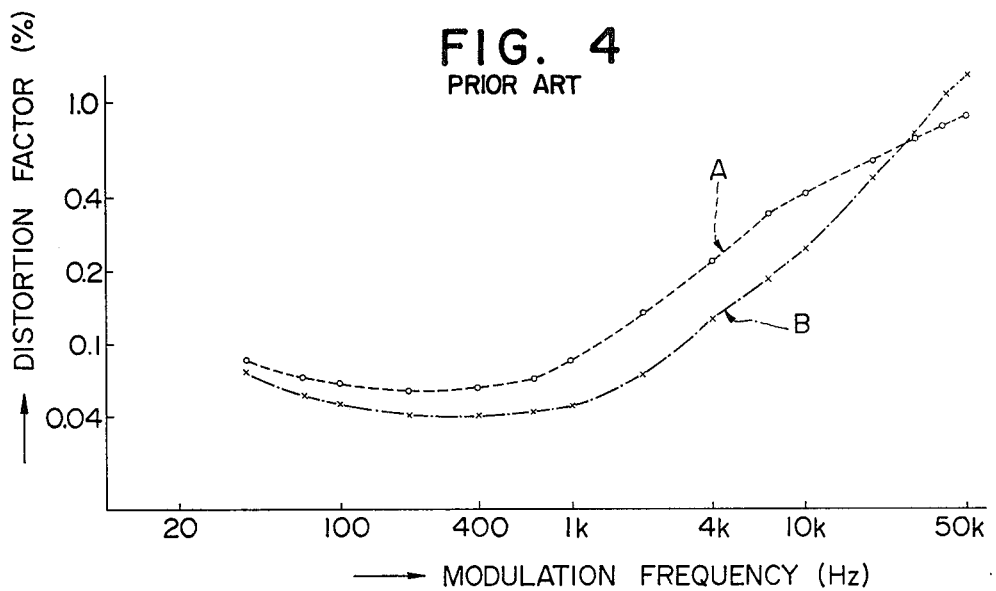
Figure 5A:
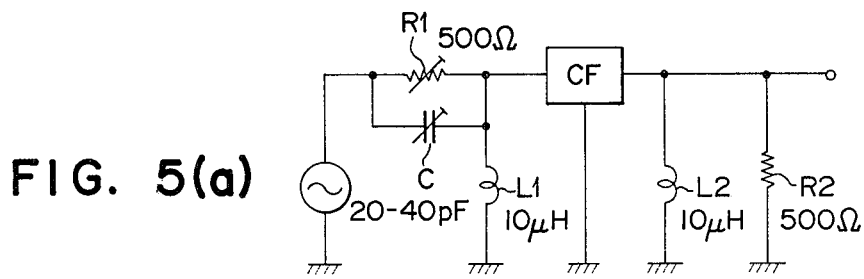
Figure 5B:
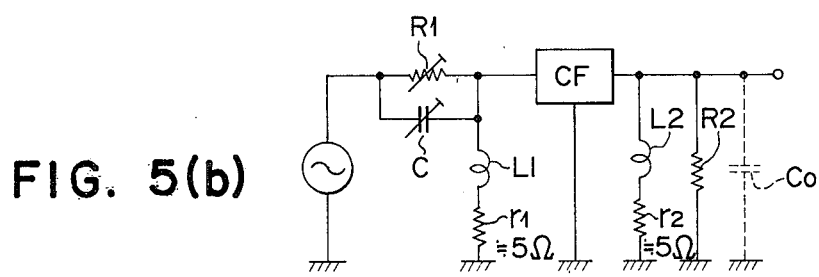

A constitutional diagram of a ceramic filter circuit according to this invention is shown in FIG. 5(a) wherein a parallel connection of a resistor R1 and a capacitor C are connected in series to the input side of the ceramic filter CF in trapped energy mode, and inductor L1 is connected in shunt thereto, an inductor L2 and a resistor R2 are connected in shunt at the output side. FIG. 5(b) is an equivalent circuit of the circuit of FIG. 5 (a), r1 representing internal resistance of the coil L1 and r2 of the coil L2. The network consisting of the resistor R1, the capacitor C and the inductor L1 is observed as a parallel resonance circuit when viewed back from the input side of the ceramic filter element CF. The resonance frequency is set as slightly deviated from the center frequency of the ceramic vibrator element CF (10.7 MHz), whereby the network exhibits a reactance (either capacitive or inductive) against the ceramic element CF.

Figure 6:
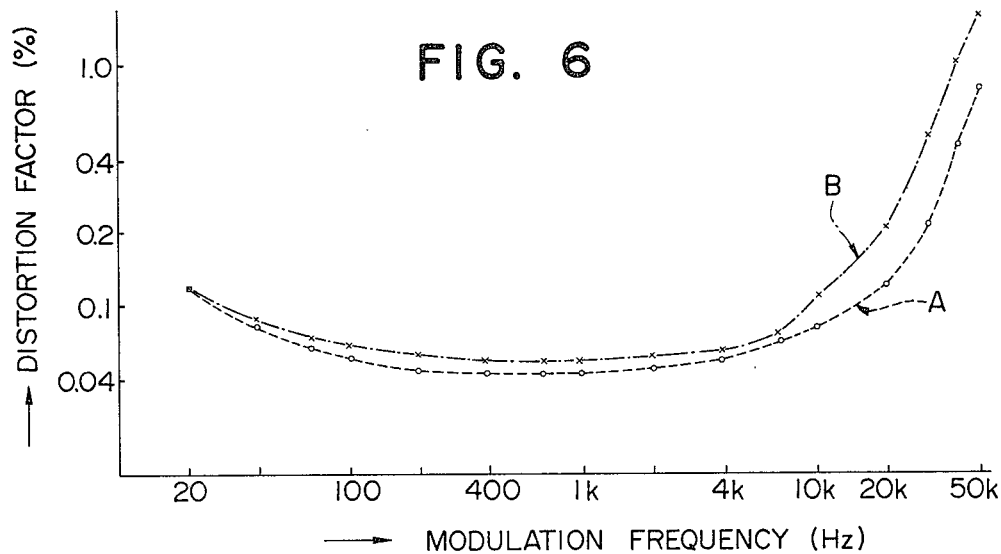

After the experiments by the inventor, in the above circuit, the inductors L1 and L2 are acceptable of a fixed value type. Adjustment of only the capacitor C and the resistor R1 brings a distortion factor below 0.1% at 30Hz – 10 kHz as shown in FIG. 6, the distortion factor curve being almost flat within the modulation frequency range of 40Hz – 7kHz. The curves A and B show the characteristics with the different ceramic filters showing only little difference only in high frequency region. The carrier frequency in IF stages is usually 10.7 MHz.

Figure 7:
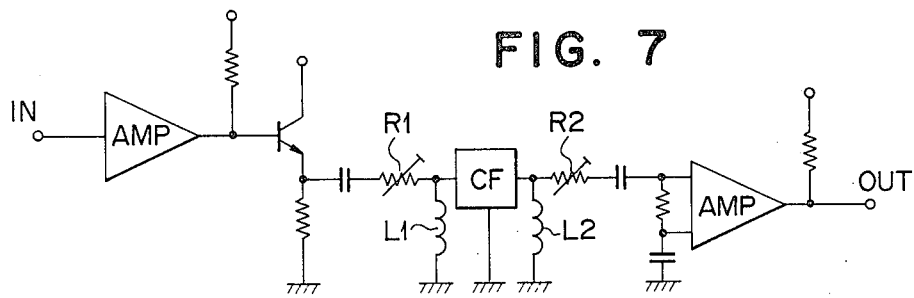
Figure 8:
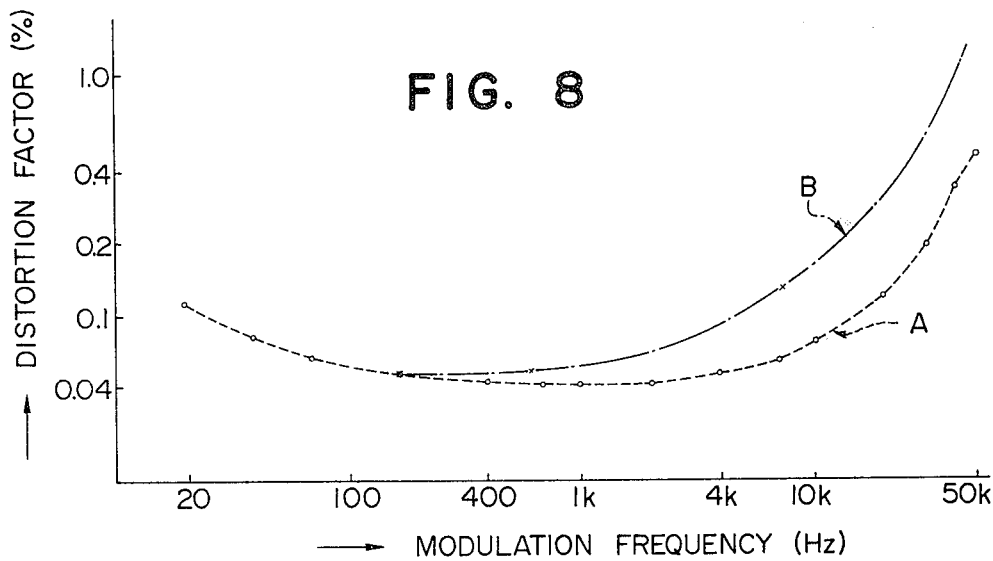

FIG. 7 shows another emebodiment of this invention wherein a resistor R1 in series and an inductor in parallel L1 are connected at an input side of the ceramic filter CF, a resistor R2 in series and an inductor L2 in parallel are connected at an output side of the filter element CF thereby permitting both resistors R1 and R2 to be adjusted. The ceramic filter CF is the same one as used in FIG. 5.

Thus, a ceramic filter circuit is obtained wherein its distortion factor is below 0.1% at 40Hz – 4kHz of the modulation frequency. This circuit provides a slightly inferior characteristic to the one shown in the circuit of FIG. 5 but provide still superior characteristic to the conventional filters.

As was abovedescribed, this invention is utilized to decrease the distortion factor of the frequency modulation wave caused by its passing through the ceramic filter and to adjust the ceramic filters having different distortion factors to approximately the same characteristics.

The foregoing description has included specific examples of this invention, but it will be apparent that various modifications can be made without departing from the scope of the invention as set forth in the claims.

What I claim is:

1. A filter circuit for a wide band system comprising in combination a ceramic filter element having a wide pass band, said filter element having an input and an output, first circuit means connected to said input of said ceramic filter element for decreasing the distortion factor of a wide band signal passing through said ceramic filter, said first circuit means including a resistor connected in series with said ceramic filter element and connected to the input thereof, an inductor connected to the input of said ceramic filter element and in shunt with said ceramic filter element, and second circuit means connected to said output of said ceramic filter element for decreasing the distortion factor of a signal passing through said ceramic filter element, said second circuit means including a resistor connected in series with the output of said ceramic filter element and an inductor connected to the output of said ceramic filter element and in shunt therewith.

2. A filter circuit according to claim 1 wherein both resistors are of an adjustable type.

3. A filter circuit for a wide band system comprising a ceramic vibrational filter element having an input and an output, said ceramic filter element having a relatively wide bandwidth and relatively large phase distortion,
a first resonant circuit means connected to the input of said ceramic filter element for decreasing the phase distortion of a wide band signal passing through said filter element, and
a second resonant circuit means connected to the output of said filter element for decreasing the phase distortion of a wide band signal passing through said filter element.

4. A filter circuit for a wide band system comprising in combination a ceramic filter element having a wide pass band, said filter element having an input and an output, first circuit means connected to said input of said ceramic filter element for decreasing the distortion factor of a wide band signal passing through said ceramic filter, said first circuit means including a parallel connection of a first resistor and a capacitor connected in series to said input of said ceramic filter element, and a first inductor connected to said input of said ceramic filter element in shunt therewith, and second circuit means connected to said output of said ceramic filter element for decreasing the distortion factor of a signal passing through said ceramic filter element, said second circuit means including an inductor and a resistor both connected in shunt to said output of said ceramic filter element.

5. A filter circuit according to claim 1 wherein said capacitor is of an adjustable type.

* * * * *